United States Patent
Gavryliuk et al.

(10) Patent No.: US 10,840,885 B2
(45) Date of Patent: Nov. 17, 2020

(54) FILTER AND METHOD OF DESIGNING AN RF FILTER

(71) Applicant: RF360 Europe GmbH, Munich (DE)

(72) Inventors: Oleksandr Gavryliuk, San Diego, CA (US); Mykola Shevelov, Munich (DE); Petro Komakha, San Diego, CA (US); Georgiy Sevskiy, Munich (DE); Alexander Chernyakov, Munich (DE); Wai San Wong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 16/169,824

(22) Filed: Oct. 24, 2018

(65) Prior Publication Data

US 2019/0123717 A1    Apr. 25, 2019

Related U.S. Application Data

(60) Provisional application No. 62/576,537, filed on Oct. 24, 2017.

(51) Int. Cl.
*H03H 9/54* (2006.01)
*H03H 7/01* (2006.01)
(Continued)

(52) U.S. Cl.
CPC .......... *H03H 9/545* (2013.01); *H03H 7/0115* (2013.01); *H03H 7/1741* (2013.01);
(Continued)

(58) Field of Classification Search
CPC .... H03H 9/545; H03H 7/0115; H03H 7/1741; H03H 9/542; H03H 9/605; H03H 9/6483; H03H 9/6489
(Continued)

(56) References Cited

U.S. PATENT DOCUMENTS

| | | | | |
|---|---|---|---|---|
| 5,631,612 A | * | 5/1997 | Satoh | H03H 9/0576 333/193 |
| 6,909,338 B2 | * | 6/2005 | Omote | H03H 9/542 333/133 |

(Continued)

FOREIGN PATENT DOCUMENTS

DE    102004045179 A1    3/2006
WO     2006032366 A1    3/2006

OTHER PUBLICATIONS

Fattinger et al.,"Thin Film Bulk Acoustic Wave Devices for Applications at 5.2 GHz", 2003 IEEE Ultrasonics Symposium, Munich, Germany (Year: 2003).*

(Continued)

*Primary Examiner* — Benny T Lee
*Assistant Examiner* — Hafizur Rahman
(74) *Attorney, Agent, or Firm* — Qualcomm Incorporated (57) ABSTRACT

A filter and a method for forming a filter are disclosed. In an embodiment a filter includes a first port, a second port and a signal path between the first port and the second port. The filter further includes a plurality of series resonators electrically connected in series in the signal path, a plurality of shunt paths, each electrically connecting the signal path to ground and one parallel resonator electrically connected in each shunt path, wherein at least one series resonator is an electroacoustic resonator, and wherein at least one parallel resonator comprises one acoustically inactive capacitor or an electrical connection of an acoustically active resonator and a de-tuning coil.

16 Claims, 5 Drawing Sheets

(51) Int. Cl.
*H03H 9/60* (2006.01)
*H03H 9/64* (2006.01)

(52) U.S. Cl.
CPC ............ *H03H 9/542* (2013.01); *H03H 9/605* (2013.01); *H03H 9/6483* (2013.01); *H03H 9/6489* (2013.01)

(58) Field of Classification Search
USPC ......................................................... 333/188
See application file for complete search history.

(56) References Cited

U.S. PATENT DOCUMENTS

2017/0134005 A1    5/2017   Takeuchi et al.
2019/0372549 A1*  12/2019   Houlden .................. H03H 3/02

OTHER PUBLICATIONS

API Technologies Corporation White paper, "Introduction to Saw Filter Theory & Design Techniques",p. 1, RF, Microwave & Microelectronics, www.apitech.com, published in Microwave Journal on Oct. 15, 2019. (Year: 2019).*

Aliouane, S. et al., "RF-MEMS Switchable Inductors for Tunable Bandwidth Baw Filters," XP-031691411, 2010 International Conference on Design & Technology of Integrated Systems in Nanoscale Era, Mar. 2010, 6 pages.

Tai, C.H., et al., "A Novel Thin Film Bulk Acoustic Resonator (FBAR) Duplexer for Wireless Applications," XP-002367488, Tamkang Journal of Science and Engineering, vol. 7, No. 2, 2004, 5 pages.

* cited by examiner

FILTER AND METHOD OF DESIGNING AN RF FILTER

CROSS-REFERENCE TO RELATED APPLICATIONS

This application claims the benefit of U.S. Provisional Application No. 62/576,537, filed on Oct. 24, 2017, which application is hereby incorporated herein by reference.

TECHNICAL FIELD

The present invention refers to RF filters and to methods of designing such filters.

BACKGROUND

RF filters can be used in mobile communication equipment such as terminal devices or base stations. RF filters are used to select wanted RF signals from one or more wanted frequency ranges from unwanted RF signals of unwanted frequency ranges. To that end an RF filter has a low insertion loss for wanted frequencies and a high rejection for unwanted frequencies.

In general, the insertion loss should be as low as possible and out-of-band suppression as high as possible. Pass band skirts between these frequency ranges should be as steep as possible. Further, the possibility of providing wide bandwidths of pass bands for wanted frequency ranges is wanted in certain applications.

Known filters use resonators consisting of LC structures. LC structures comprise inductive elements (L) and capacitive elements (C). These elements can be realized as structured metallizations in a dielectric material consisting of one or more layers. Such filters can be realized utilizing an LTCC (low temperature co-fired ceramics) material or a laminate material. Further, such filters can be realized utilizing IPD (IPD=integrated passive device) technology.

Furthermore, RF filters comprising electroacoustic resonators are known. Electroacoustic resonators allow steep pass band skirts.

Finally, the combination of LC elements and electroacoustic resonators is known, e.g., from WO 2006/032366 A1.

However, the current trend towards an increasing number of RF frequencies available for wireless communication renders the use of known RF filters problematic. Specifically, in higher RF frequency ranges, e.g., frequencies above 3 GHz, the performance of known RF filters degrades, as the known filters fail to comply with upcoming filter specifications with respect to isolation, insertion loss, bandwidth, pass band skirts and attenuation outside a pass band.

SUMMARY

Embodiments provide an RF filter comprising a first port and a second port. The RF filter may have a signal path between the first port and the second port, e.g., electrically connecting the first port with the second port. The RF filter may further comprise a plurality of series resonators (two or more) electrically connected in series in the signal path. Additionally, the filter may have a plurality shunt paths (two or more). Each shunt path may electrically connect the signal path to ground. The filter may comprise one parallel resonator electrically connected in each shunt path. At least one series resonator is an electroacoustic resonator. At least one parallel resonator may be one acoustically inactive capacitor or an electrical connection of an acoustically active resonator and a de-tuning coil.

In various embodiments, a central aspect of the RF filter bases on the insight that electroacoustic resonators become problematic at higher frequencies.

Electroacoustic resonators can be BAW resonators (BAW=bulk acoustic wave), SAW resonators (SAW=surface acoustic wave) or GBAW resonators (GBAW=guided bulk acoustic wave). In such electroacoustic resonators the piezoelectric effect is utilized to convert between RF signal and acoustic waves. To that end a resonator comprises electrode structures and a piezoelectric material. In SAW resonators electrode structures are typically arranged on a top side of a piezoelectric material in an interdigitated comb-like structure. The centers of adjacent electrode fingers of such structures mainly determine half the wavelength $\lambda/2$ of the corresponding acoustic waves propagating at the top side of the piezoelectric material.

In BAW resonators a piezoelectric material is typically sandwiched between a bottom electrode and a top electrode. The resonating structure can be decoupled from its environment by a cavity below the bottom electrode or by arranging an acoustical mirror below the bottom electrode. The distance between the bottom electrode and the top electrode mainly determines half the wavelength $\lambda/2$ of the corresponding acoustic wave propagating in the piezoelectric material.

In various embodiments, it was found that unwanted spurious excitations in such resonators, e.g., bulk waves in SAW resonators, deteriorate the performance of the corresponding resonator and therefore the performance of the corresponding RF filters in particular at high frequencies above 3 GHz. These unwanted effects deteriorate the corresponding filter's transmission characteristics. Thus, known RF filters are incompatible with frequency demands concerning frequency bands with a center frequency above 3 GHz.

However, it was found that such unwanted parasitic effects, like bulk wave losses, can be turned into positive effects for a further out-of-band suppression improvement.

In various further embodiments, it was found that parasitic effects such as bulk wave losses in a pass band can be mainly caused by shunt resonators in shunt paths. The resonance frequencies of shunt resonators, e.g., of ladder-type like structures, are usually located at lower frequencies than those of series resonators. Therefore, the corresponding frequencies of these effects are much closer to the frequencies of the corresponding pass bands or even located inside the pass bands.

Thus, by replacing at least one shunt resonator, a plurality of shunt resonators or all shunt resonators by a capacitor or a combination of an electroacoustic resonator with an additional de-tuning coil can significantly improve the performance of the filter.

Series resonators may be less prone to disturbances caused by the mentioned parasitic effects. Thus, a replacement of series resonators is possible but not necessarily needed. Correspondingly, one or more or all series resonators can be maintained in the filter structure.

Correspondingly, it is possible that the RF filter has a ladder-type structure or a ladder-type like structure. In a ladder-type structure basic elements comprising a series resonator and a parallel resonator in a shunt path are electrically connected in series. Then, all series resonators are electrically connected in series in the signal path and a plurality of shunt resonators is electrically connected in a corresponding one of several shunt paths electrically connecting the signal path to ground.

Consequently, the terminology is as follows: series resonators are electrically connected in the signal (i.e., in the series) path. Shunt resonators are electrically connected in a shunt path between the signal path and ground. A resonator, e.g., a series resonator or a parallel resonator (synonym for shunt resonator) can be an electroacoustically active resonator as described above or an acoustically inactive resonator, e.g., comprising LC structures. The LC structures can comprise a series connection of a capacitive element and an inductive element or a parallel connection of an inductive element and a capacitive element.

It is possible that the at least one parallel resonator mentioned above comprises the mentioned acoustically active resonator and the de-tuning coil. The acoustically active resonator and the de-tuning coil can be electrically connected in series.

In various embodiments, this configuration, which distinguishes the RF filter from known RF filters, allows to convert unwanted parasitic effects into beneficial effects. With this configuration characteristic frequencies, e.g., of spurious excitations, can be shifted from a frequency range in which the excitations are not wanted to a frequency range in which the excitations do no harm. In a preferred embodiment the characteristic frequencies are not only shifted to a frequency range where the excitations do not disturb the proper workings of the filter, but rather to a frequency range in which the excitations help to improve the filter characteristics.

It is possible that one, two, three or more or all series resonators are electroacoustic resonators.

It is possible that, except for the at least one parallel resonator mentioned above, all other parallel resonators are electroacoustically active resonators. However, the filter topology can comprise more than one shunt path in which an electroacoustically active resonator is replaced by either an acoustically inactive capacity or by the mentioned combination of an electroacoustically active resonator and a de-tuning coil.

It is possible that the RF filter comprises an acoustically inactive capacitor of the capacitance $C_{inactive}$ in a shunt or series path, that can be replaced by an acoustically active resonator having a capacitance $C_{active}$. The capacitance $C_{active}$ of the acoustically active resonator is between 0.5 $C_{inactive}$ and 2.0 $C_{inactive}$.

Thus, it is possible that the RF filter comprises an acoustically active parallel resonator having a capacitance $C_{active}$ in a shunt path or in the signal path instead of the acoustically inactive capacitor of the capacitance $C_{inactive}$ in the same shunt path or in the signal path. The capacitance $C_{active}$ of the acoustically active resonator is between 0.5 $C_{inactive}$ and 2.0 $C_{inactive}$.

In yet other embodiments, the capacitance $C_{inactive}$ is (approximately) equal to the capacitance $C_{active}$.

It is possible that—if present—the electroacoustic resonator combined with a de-tuning coil in the mentioned shunt path or a plurality or each electroacoustic resonator of the RF filter is a BAW resonator or an SAW resonator.

In particular, SAW resonators provide the intrinsic property of bulk wave modes usually regarded as unwanted which can be shifted in frequency to enhance the electric properties of the filter.

It is possible that resonators which are acoustically inactive comprise an LC resonance circuit.

In the LC resonance circuit a capacitive element and an inductive element can be electrically connected in parallel or in series or LC resonance circuits can be connected in parallel or in series.

It is possible that the RF filter provides a first pass band.

Further, it is possible that the RF filter provides a second pass band in addition to the first pass band.

Further, it is possible that the first pass band (which may be the only pass band) or the first pass band or the second pass band (in the case of a filter with two pass bands) has a center frequency of 3 GHz or higher.

Also, it is possible that the RF filter provides two pass bands and both pass bands have a center frequency of 3 GHz or higher.

It is possible that the RF filter has the parallel resonator comprising the electrical connection of the acoustically active resonator and the de-tuning coil. Further, the resonance frequency of the acoustically active resonator is tuned to a frequency higher than a resonance frequency of the resonator of another shunt path. Further, the de-tuning coil tunes the resonance frequency of the electrical connection of the acoustically active resonator and the de-tuning coil to a frequency lower than the resonance frequency of the acoustically active resonator (with the resonance frequency shifted upwards).

Further, it is possible that bulk waves increase the suppression in a frequency range outside the pass band.

In further embodiments, the measures stated above provide the potential of not only avoiding detrimental effects of unwanted spurious modes, but to further enhance the filter's characteristics by utilizing such modes at specific, advantageous frequency positions: an electroacoustic resonator in which corresponding parasitic effects take place usually has a resonance frequency and an anti-resonance frequency, e.g., unwanted bulk wave modes disturb the electroacoustic resonator's frequency response at frequencies above the anti-resonance frequency. By tuning the electroacoustic resonator to shift its characteristic frequencies to higher frequency values (outside the filter's pass band), the resonance frequency is raised, the anti-resonance frequency is raised and the frequencies of the modes usually regarded as unwanted are also shifted to higher frequencies. The tuning of the resonator can be performed such that the characteristic frequencies of the unwanted modes are shifted to a frequency where a high suppression is wanted.

In other embodiments, the electroacoustic resonator as a whole cannot be used in this specific configuration because its resonance frequency—without further measures—is too high. The additional de-tuning coil can selectively lower the resonance frequency of the resonator with respect to the characteristic frequencies of the unwanted modes. Thus, the combination of the electroacoustic resonator and the de-tuning coil can have a resonance frequency that equals or approximately equals the original resonance frequency of the non-tuned electroacoustic resonator. Correspondingly, the electroacoustic resonator in its tuned state combined with a de-tuning coil can be used in the filter topology while the characteristic frequencies of unwanted modes remain shifted in frequency.

In yet other embodiments, the tuning of an individual resonator, e.g., a SAW resonator or a BAW resonator, to higher frequencies so that their parasitic loss region is also moved to a higher frequency, away from a possible pass band, preferably to the region where high attenuation is needed and by additionally detuning the resonance frequency of the tuned resonator via the de-tuning coil, the resonance frequency is shifted back, while the parasitic modes remain at higher desired frequencies.

Correspondingly, a method of designing an RF filter may comprise the following steps: providing a first port and a second and a signal path between the first port and the second port, providing a shunt path electrically connecting the signal path to ground, electrically connecting a parallel electroacoustic resonator and a de-tuning coil in the shunt path, tuning the electroacoustic resonator to a higher resonance frequency, tuning a resonance frequency of the electrical connection of the electroacoustic resonator and the de-tuning coil to a frequency lower than the resonance frequency of the electroacoustic resonator.

Further, it is possible that bulk waves of the electroacoustic resonator are used to increase the out-of-band suppression of the RF filter.

In various embodiments, by replacing resonators acoustically inactive capacitor by with capacitors a combination of acoustically active resonator or by replacing resonators by combinations of resonators tuned to a higher frequency and followed by a de-tuning coil for tuning the combination to a lower frequency, not only the filter characteristics in which unwanted effects due to spurious modes are prevented. Furthermore, filter characteristics with improved properties compared to filters where no spurious modes would take place are obtained.

In addition, it is possible that the RF filter comprises a low pass electrically connected in series in the signal path between the first port and the second port.

BRIEF DESCRIPTION OF THE DRAWINGS

Central aspects of the present RF filter and details of preferred embodiments are shown in the schematic accompanying figures.

DETAILED DESCRIPTION OF ILLUSTRATIVE EMBODIMENTS

Figure 1:
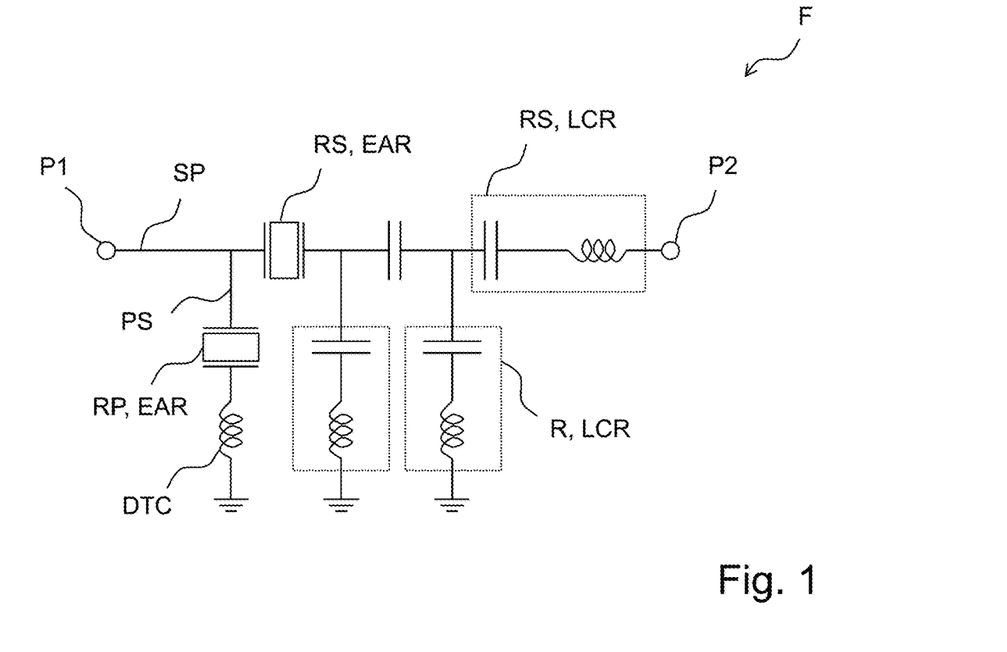
FIG. 1 shows a possible equivalent circuit diagram of an RF filter.

FIG. 1 shows a possible implementation of the RF filter F. The filter F has a first port P1 and a second port P2. A signal path SP is arranged between the first port P1 and the second port P2 and electrically connects the first port P1 to the second port P2. In the signal path series resonators RS are electrically connected in series. One series resonator RS is an electroacoustically active resonator EAR. The other series resonator RS is an LC resonator LCR comprising a capacitance element and an inductance element connected in series.

The filter topology of the filter F shown in FIG. 1 has three shunt paths electrically connecting the signal path SP to ground. In the first shunt path as seen from the point of view of the first port P1, a parallel resonator RP and a de-tuning coil DTC are electrically connected in series. Thus, the shunt path PS electrically connects the first port P1 to ground.

It is to be noted that each of the first port P1 and the second port P2 can be an input port provided to receive an RF signal form an external environment. The respective other port is then the output port provided to transmit the filtered RF signal to an external circuit environment.

In the two other shunt paths PS a respective further resonator R being realized as an LC resonator LCR is arranged.

It is to be noted that the de-tuning coil DTC connected to the electroacoustic parallel resonator RP differs from conventional inductive elements that may be present in shunt paths of ladder-type like structures. Conventional inductive elements can be realized as unavoidable external connections to ground, e.g., bump connections and their inductance value is chosen such that filter characteristics without consideration of spurious modes and parasitic effects are optimized. In contrast, the inductance value of the de-tuning coil DTC is chosen such that a frequency shift of the same absolute value but of the opposite direction compared to the frequency shift applied to the resonator considered alone, is obtained.

Figure 2:
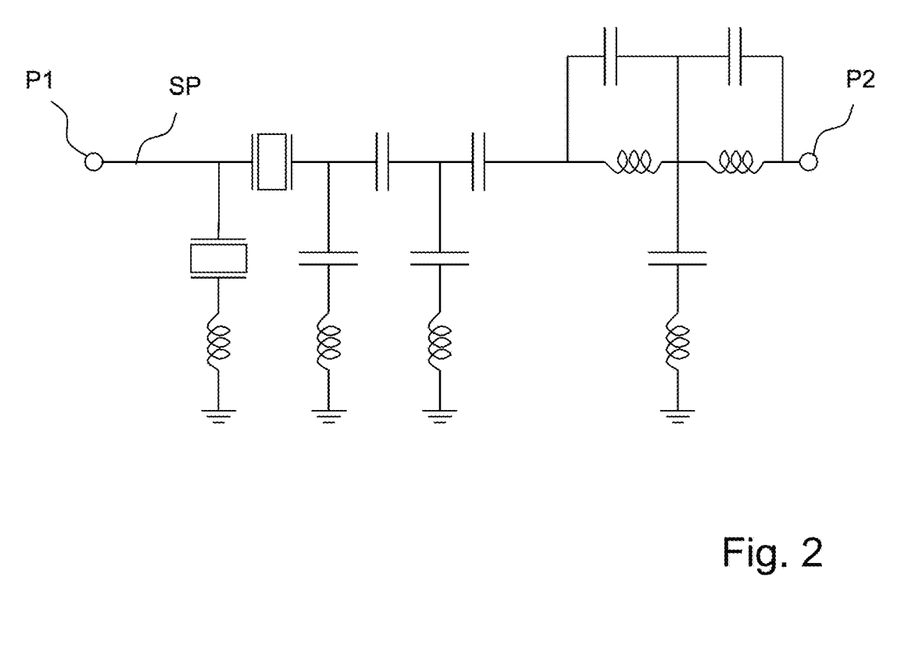
FIG. 2 shows an equivalent circuit diagram including further filter elements.

FIG. 2 illustrate the possibility of arranging further electrical components such as capacitance elements and inductance elements in the filter. In addition to basic elements of a ladder-type configuration comprising a series element and a shunt path, two further inductance elements in the signal path, a further inductance element in a further shunt path and two further capacitance elements parallel to the additional inductance elements are possible. The two inductance elements in the signal path SP are electrically connected in series. Each of the two capacitance elements is electrically connected in parallel to a respective inductance element in the signal path. The additional shunt path comprises a series connection of a capacitance element and an inductance element. One electrode of the capacitance element in the additional shunt path is electrically connected to one electrode of each inductance element in the signal path and to one electrode of each of the capacitance elements parallel to the inductance elements in the signal path.

Figure 3:
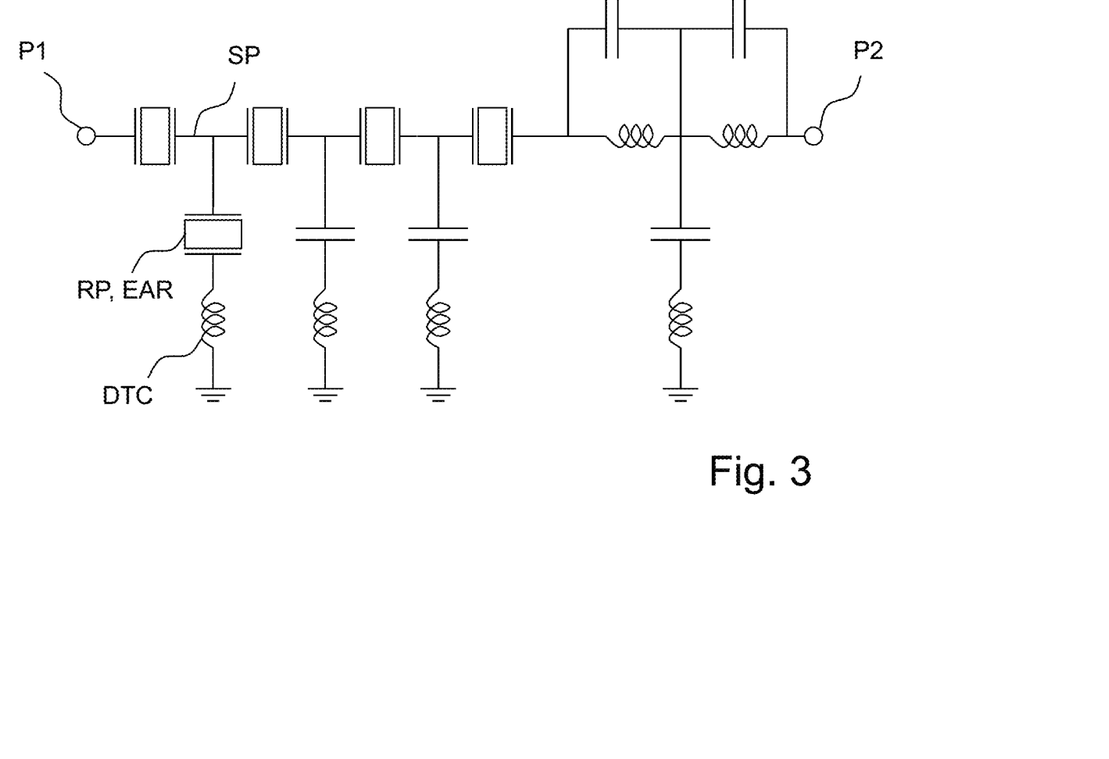
FIG. 3 shows a filter topology with more than one series electroacoustic resonator.

FIG. 3 illustrates the possibility of having each resonator in the signal path SP being realized as an electroacoustic resonator.

At least one shunt path comprises an electroacoustic resonator in combination with a de-tuning coil. The remaining shunt paths, or some of the remaining shunt paths, can be endowed with electroacoustic resonators or with LC resonators.

Figure 4:
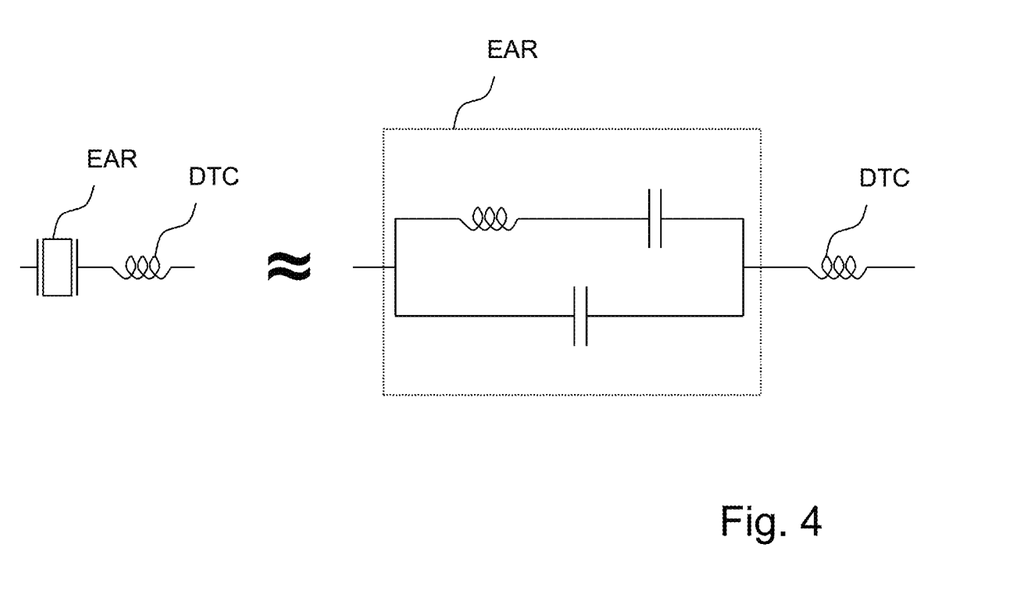
FIG. 4 shows an equivalent circuit diagram of an electroacoustic resonator.

FIG. 4 illustrates the equivalent circuit diagram of an electroacoustic resonator EAR. An electroacoustic resonator EAR can be regarded as a parallel connection of a capacitance element in parallel to a series connection including an inductance element and a capacitance element.

Figure 5:
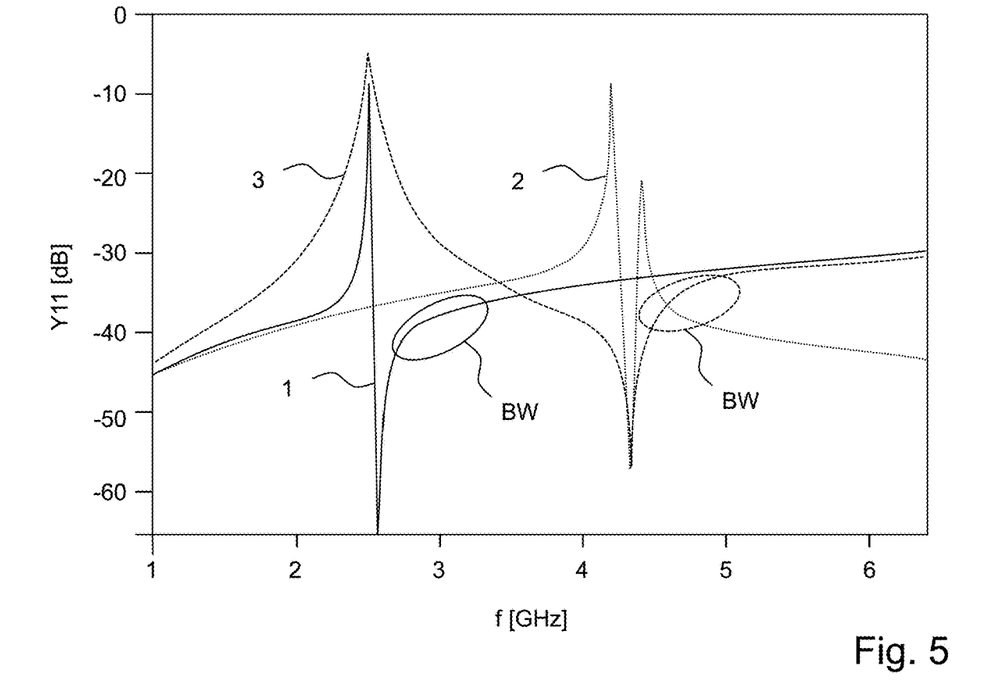
FIG. 5 illustrates the working principle of tuning the electroacoustic resonator and the tuning back via the de-tuning coil.

FIG. 5 illustrates a central aspect of the RF filter: curve 1 shows the frequency-dependent matrix element $Y_{11}$ of a conventional electroacoustic resonator. The conventional resonator has a resonance frequency and an anti-resonance frequency at a frequency slightly higher than the resonance frequency. In the frequency range denoted as BW parasitic effects, e.g., caused by bulk waves, can take place.

In a first step the electroacoustic resonator is detuned by shifting characteristic frequencies to higher frequency positions. Correspondingly, curve 2 shows the shifted resonance frequency, anti-resonance frequency and parasitic frequencies (BW). The electroacoustic resonator is preferably detuned such that the frequencies of parasitic effects are shifted to a frequency position where the unwanted excitations do not harm a proper functioning of the filter, or preferably to a frequency position where the unwanted effects can contribute to enhance the filter characteristics.

Finally, in a second step, the characteristic resonance frequency is shifted back utilizing the de-tuning coil while mainly maintaining the frequency position of the parasitic effects at their preferred position.

As a consequence, parasitic effects do not further harm the frequency characteristics but contribute to enhance the frequency characteristics and by separating the resonance frequency and the resonance frequency a possibly wider bandwidth can be obtained.

Figure 6:
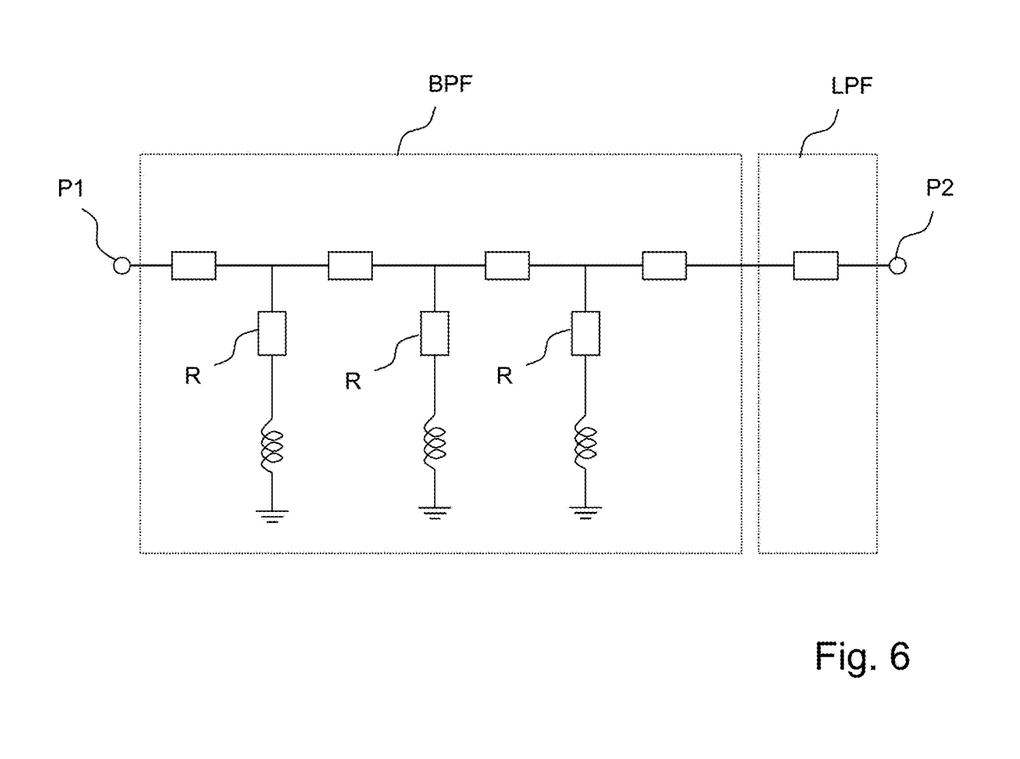
FIG. 6 illustrates the possibility of further electrically connecting a low pass filter.

FIG. 6 illustrates the possibility of arranging a low pass filter LPF between the first port P1 and the second port P2. The other circuit elements establish a band pass filter BPF with one or two pass bands.

Figure 7:
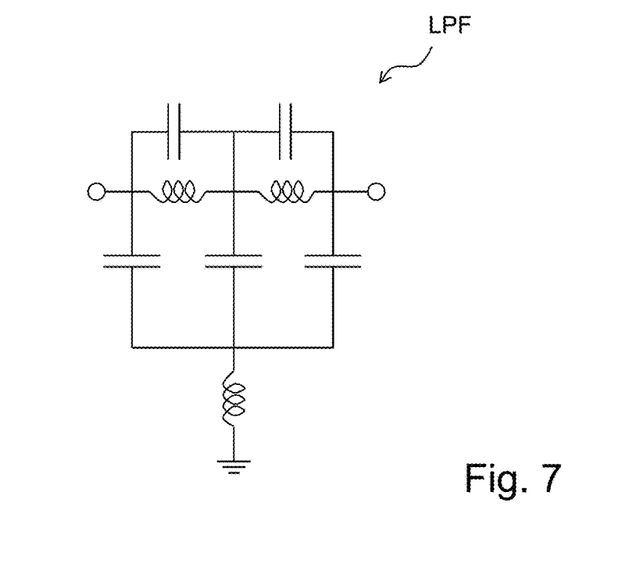
FIG. 7 shows a possible implementation of a low pass filter.

FIG. 7 illustrates an equivalent circuit diagram of a possible low pass filter LPF. The low pass filter LPF can have two inductance elements electrically connected in series. For each inductance element of the inductance elements in the signal path one capacitance element is provided in parallel to the corresponding inductance element. Further, three shunt paths electrically connecting the signal path to ground are provided. In each shunt path one capacitance element is electrically connected. All three shunt paths are shunted to the ground connection utilizing a single further shunt inductance element.

Figure 8:
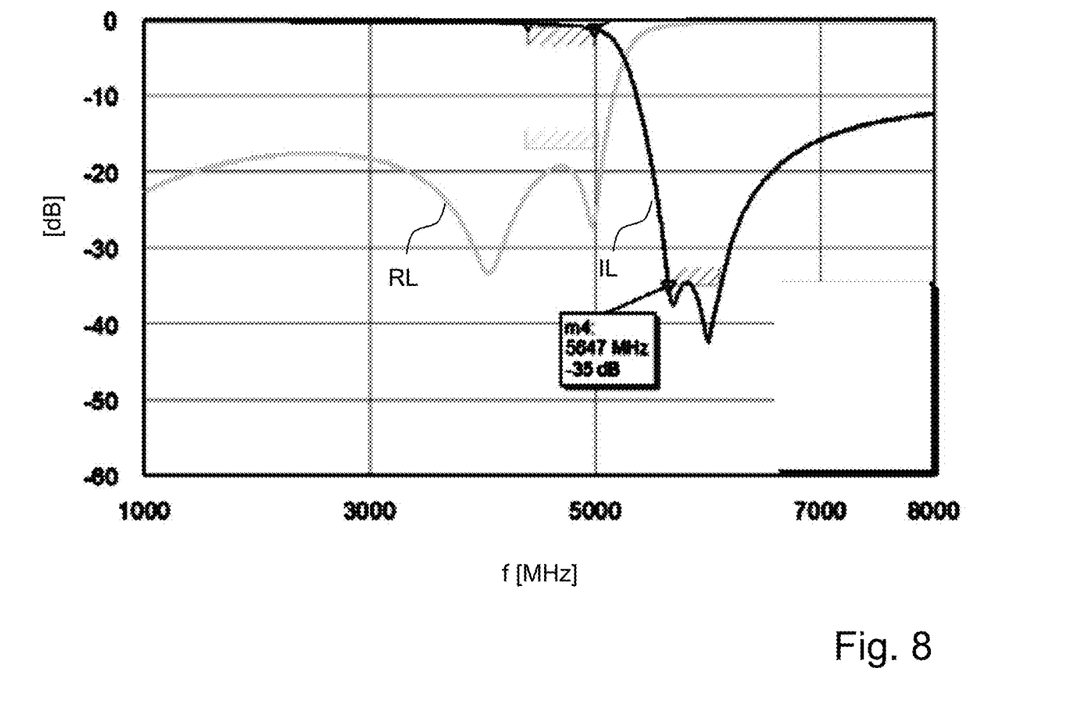
FIG. 8 illustrates frequency-dependent characteristics of an RF filter including a low pass filter.

FIG. 8 illustrates the return loss (RL) and the insertion loss IL of a filter having the topology as shown in FIG. 7.

Figure 9:
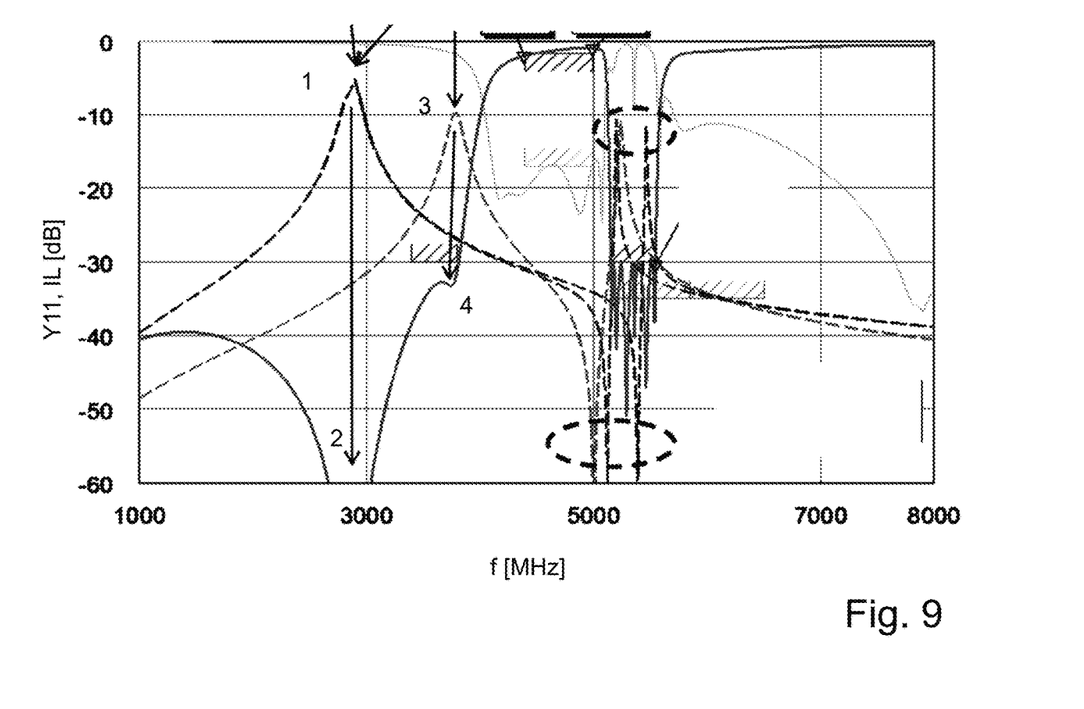
FIG. 9 illustrates the performance of an RF filter without a low pass filter.

FIG. 9 illustrates a frequency response of an RF filter corresponding to the topology of FIG. 6 without a consideration of the effects of the low pass filter LPF. The resonance frequencies of the combinations of the electroacoustic resonators and the corresponding de-tuning coils from the first shunt path and the third shunt path are chosen to coincide at the resonance 1. The resonance frequency of the combination of the electroacoustic resonator and the de-tuning coil of the centered shunt path is chosen to coincide with the resonance 3.

Resonances in shunt paths correspond to poles in the insertion loss of the corresponding filter. Thus, resonance 1 causes pole 2 and resonance 3 causes pole 4. At frequency ranges above 5 GHz the dashed ellipses indicate the position of formally unwanted and now preferred parasitic effects now helping to improve the filter characteristics.

Figure 10:
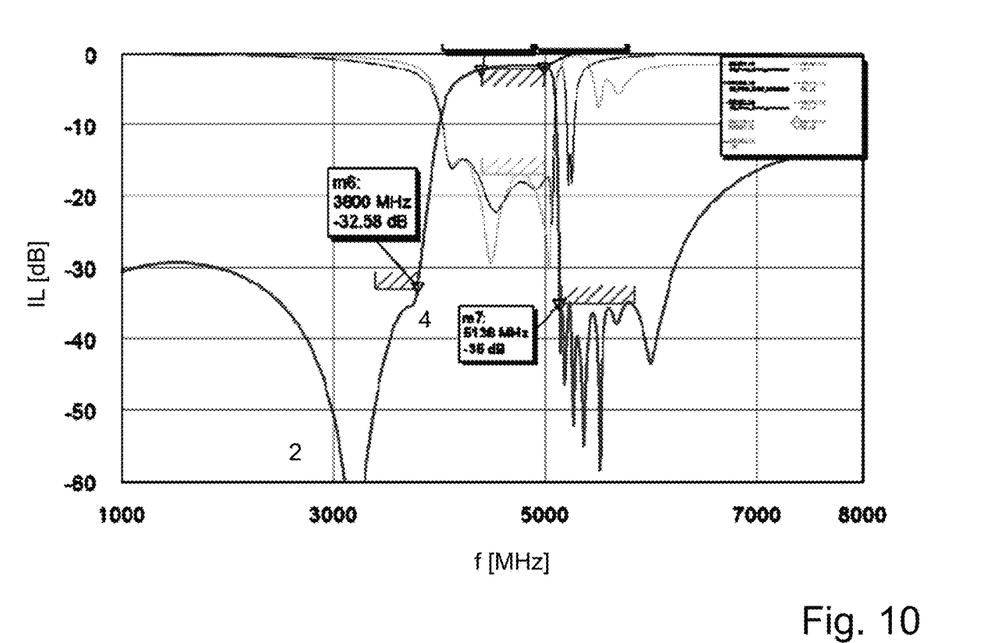
FIG. 10 illustrates the performance of an RF filter including the performance of a low pass filter.

Correspondingly, FIG. 10 illustrates the filter characteristics of the filter topology shown in FIG. 6 while the effect of the low pass filter is also considered. The necessary filter requirements concerning low insertion loss in the pass band and high attenuation outside the pass band are fulfilled.

Neither the RF filter nor the method for designing an RF filter is limited by the presented subject-matter and its technical features. RF filters comprising further filter elements and methods for designing an RF filter comprising further designing steps are also comprised.

What is claimed is:

1. An RF filter comprising:
   a first port;
   a second port;
   a signal path between the first port and the second port;
   a plurality of series resonators electrically connected in series in the signal path;
   a plurality of shunt paths, wherein each shunt path electrically connects the signal path to ground; and
   a respective parallel resonator electrically connected in each shunt path of the plurality of shunt paths,
   wherein at least one series resonator of the plurality of series resonators is an electroacoustic resonator, and
   wherein the parallel resonator in at least one shunt path of the plurality of shunt paths comprises an electrical connection of an acoustically active resonator and a de-tuning coil, the acoustically active resonator having a higher resonance frequency than another parallel resonator in another shunt path of the plurality of shunt paths, wherein the de-tuning coil has an inductance value that tunes a resonance frequency of the parallel resonator in the at least one shunt path to be lower than the higher resonance frequency of the acoustically active resonator.

2. The RF filter of claim 1, wherein the acoustically active resonator and the de-tuning coil are electrically connected in series.

3. The RF filter of claim 1, wherein all series resonators of the plurality of series resonators are electroacoustic resonators.

4. The RF filter of claim 1,
   wherein at least one of either the plurality of series resonators or respective parallel resonator in each of the plurality of shunt paths is acoustically active, has a capacitance $C_{active}$, and is a replacement of an acoustically inactive capacitor of the capacitance $C_{inactive}$, and
   wherein the capacitance $C_{active}$ is between 0.5 $C_{inactive}$ and 2.0 $C_{inactive}$.

5. The RF filter of claim 1, wherein each electroacoustic resonator is a BAW resonator or a SAW resonator.

6. The RF filter of claim 1, wherein the at least one shunt path is a first shunt path, wherein the RF filter further comprises an LC resonance circuit that forms at least one of: the parallel resonator in a second shunt path of the plurality of shunt paths; or at least one series resonator of the plurality of series resonators.

7. The RF filter of claim 1, wherein the RF filter provides a first pass band.

8. The RF filter of claim 7, wherein the first pass band has a center frequency that is greater than or equal to 3 GHz.

9. The RF filter of claim 7, wherein the RF filter provides a second pass band with a center frequency ≥3 GHz.

10. The RF filter claim 1, wherein bulk waves increase an insertion loss in a frequency range outside a pass band.

11. A method for forming an RF filter, the method comprising:
   providing a first port, a second port, and a signal path between the first port and the second port;
   providing a shunt path electrically connecting the signal path to ground;
   electrically connecting a parallel electroacoustic resonator and a de-tuning coil in the shunt path;
   forming the parallel electroacoustic resonator to have a higher resonance frequency; and
   tuning a resonance frequency of the electrical connection of the parallel electroacoustic resonator and the de-tuning coil to a frequency lower than the higher resonance frequency of the parallel electroacoustic resonator.

12. The method of claim 11, wherein bulk waves of the parallel electroacoustic resonator are used to increase out-of-band suppression of the RF filter.

13. An RF filter comprising:
a first port;
a second port;
a signal path between the first port and the second port;
a plurality of series resonators electrically connected in series in the signal path;
a plurality of shunt paths, wherein each of the plurality of shunt paths electrically connects the signal path to ground; and
a respective parallel resonator electrically connected in each shunt path of the plurality of shunt paths,
wherein at least one series resonator of the plurality of series resonators is an electroacoustic resonator, and
wherein the parallel resonator in at least one shunt path of the plurality of shunt paths comprises one acoustically inactive capacitor or an electrical connection of an acoustically active resonator and a de-tuning coil, wherein bulk waves of the acoustically active resonator increase an insertion loss in a frequency range outside a pass band of the RF filter.

14. The RF filter of claim 13, the acoustically active resonator having a higher resonance frequency than another parallel resonator in another shunt path of the plurality of shunt paths, wherein the de-tuning coil has an inductance value that tunes a resonance frequency of the parallel resonator in the at least one shunt path lower than the higher resonance frequency of the acoustically active resonator.

15. An RF filter comprising:
a first port;
a second port;
a signal path between the first port and the second port;
a plurality of series resonators electrically connected in series in the signal path;
a plurality of shunt paths, wherein each shunt path electrically connects the signal path to ground; and
a respective parallel resonator electrically connected in each shunt path of the plurality of shunt paths,
wherein at least one series resonator of the plurality of series resonators is an electroacoustic resonator, and
wherein the parallel resonator in at least one shunt path of the plurality of shunt paths comprises an electrical connection of an acoustically active resonator and a de-tuning coil, the acoustically active resonator having a higher resonance frequency that is outside a pass band of the RF filter, wherein the de-tuning coil has an inductance value that tunes a resonance frequency of the parallel resonator in the at least one shunt path to be lower than the higher resonance frequency of the acoustically active resonator.

16. The RF filter claim 15, wherein bulk waves of the acoustically active resonator increase suppression in a frequency range outside the pass band.

* * * * *